US009429966B2

(12) United States Patent
Priel et al.

(10) Patent No.: US 9,429,966 B2
(45) Date of Patent: Aug. 30, 2016

(54) INTEGRATED CIRCUIT DEVICE, VOLTAGE REGULATION CIRCUITRY AND METHOD FOR REGULATING A VOLTAGE SUPPLY SIGNAL

(75) Inventors: Michael Priel, Netanya (IL); Dan Kuzmin, Givat Shmuel (IL); Anton Rozen, Gedera (IL)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 278 days.

(21) Appl. No.: 13/979,860

(22) PCT Filed: Jan. 31, 2011

(86) PCT No.: PCT/IB2011/050418
§ 371 (c)(1),
(2), (4) Date: Jul. 16, 2013

(87) PCT Pub. No.: WO2012/104673
PCT Pub. Date: Aug. 9, 2012

(65) Prior Publication Data
US 2013/0300386 A1 Nov. 14, 2013

(51) Int. Cl.
G05F 1/46 (2006.01)
G11C 5/14 (2006.01)

(52) U.S. Cl.
CPC ............... *G05F 1/462* (2013.01); *G11C 5/147* (2013.01)

(58) Field of Classification Search
CPC ...... G06F 1/3203; G06F 1/3296; G06F 1/26; G06F 1/206; G06F 1/28; G06F 1/3243; G06F 1/3246; G06F 1/3287; G06F 2217/78; G11C 5/147

USPC .......... 323/282–285; 713/300, 310, 320, 340
See application file for complete search history.

(56) References Cited

U.S. PATENT DOCUMENTS 6,908,227 B2 * 6/2005 Rusu ...................... G01K 1/026
374/141
7,667,447 B2 2/2010 Huang et al.
(Continued)

FOREIGN PATENT DOCUMENTS

| CN | 201340448 | 11/2009 |
| CN | 101438496 | 6/2013 |
| WO | 2008083906 | 7/2008 |

OTHER PUBLICATIONS

International Search Report and Written Opinion correlating to PCT/IB2011/050418 dated Nov. 25, 2011.

*Primary Examiner* — Adolf Berhane
*Assistant Examiner* — Henry Lee, III

(57) ABSTRACT

An integrated circuit (IC) device is provided that includes at least one internal voltage regulator arranged to receive a voltage supply signal at a first input thereof, receive a control signal at a second input thereof, regulate the received voltage supply signal in accordance with the received control signal, and provide a regulated voltage supply signal at an output thereof. The IC device further includes at least one voltage regulation power control module operably coupled to the second input of the at least one internal voltage regulator and arranged to provide the control signal thereto. The voltage regulation power control module is further arranged to receive at least one IC device conditional indication, and generate the control signal for the at least one internal voltage regulator based at least partly on an available thermal power budget for the IC device corresponding to the at least one IC device conditional indication.

18 Claims, 3 Drawing Sheets

(56) References Cited

U.S. PATENT DOCUMENTS

| | | |
|---|---|---|
| 7,733,678 B1 | 6/2010 | Notohamiprodjo et al. |
| 2005/0218725 A1 | 10/2005 | Strauss |
| 2005/0223251 A1* | 10/2005 | Liepe ................. H03K 19/0008 713/322 |
| 2006/0271799 A1* | 11/2006 | Shiratake .................. G06F 1/26 713/300 |
| 2007/0198863 A1* | 8/2007 | Bose ....................... G06F 1/206 713/300 |
| 2008/0022140 A1* | 1/2008 | Yamada .................. G06F 1/206 713/322 |
| 2008/0067995 A1 | 3/2008 | Chua-Eoan et al. |
| 2008/0111534 A1 | 5/2008 | Ravichandran |
| 2008/0219080 A1 | 9/2008 | Geens et al. |
| 2008/0231352 A1 | 9/2008 | Kurd et al. |
| 2010/0213919 A1* | 8/2010 | Takayanagi ............. G06F 1/206 323/318 |
| 2014/0359311 A1* | 12/2014 | Jahagirdar ................ G06F 1/26 713/300 |
| 2014/0380076 A1* | 12/2014 | Weissmann ............. G06F 1/324 713/323 |

* cited by examiner

INTEGRATED CIRCUIT DEVICE, VOLTAGE REGULATION CIRCUITRY AND METHOD FOR REGULATING A VOLTAGE SUPPLY SIGNAL

FIELD OF THE INVENTION

The field of this invention relates to an integrated circuit device, voltage regulation circuitry and a method for regulating a voltage supply signal within an integrated circuit device.

BACKGROUND OF THE INVENTION

In the field of integrated circuit devices, and in particular in the field of application processor integrated circuit devices, modern integrated circuit devices are required to provide increasingly high performance whilst bring also required to fulfil increasingly stringent power consumption and thermal energy dissipation requirements.

In order to optimise power consumption and performance, it is known to use on-chip power management techniques that regulate voltage and frequency settings within the respective integrated circuit device depending upon current performance/power requirements. Such power management techniques include power gating and dynamic voltage frequency scaling (DVFS), etc. In order to enable such power management, voltage regulators are required. However, a problem arising from the use of such voltage regulators is that their use physically 'on-chip' often results in an increased thermal power budget requirement for power dissipation of the integrated circuit device package for high frequency devices. This results in an increase in cost and (significantly) size of the integrated circuit package. The power dissipated by a regulator may be approximated, as shown in Equation 1 below:

$$P_{dis} \approx I_{reg} * (V_{in} - V_{out}) \qquad [\text{Eq. 1}]$$

A known solution to this problem is to provide a simple regulator, located external to the integrated circuit device to act as a pre-regulator, and then to provide a more sophisticated on-chip regulator to provide the final required voltage. In this manner, the requirements for the on-chip regulator may be reduced, thereby enabling tighter thermal power budgets. However, such a solution still requires careful control of the on-chip regulator in order to meet the tight thermal power budgets. This typically requires the on-chip regulator to be kept in a 'bypass' mode for the highest frequencies, in order to minimize its power consumption, with the external regulator providing the voltage regulation at such high frequencies.

Referring first to FIGS. 1 and 2, a known thermal budget for the integrated circuit (IC) device is defined by a thermal limit 110 up to which the packaging for the IC device is capable of effectively dissipating thermal power. A significant proportion of the thermal budget for the IC device is taken up by dynamic and leakage power consumed by SoC (System on Chip) internal modules, etc., as illustrated at 120. The remaining available thermal power budget, illustrated at 130 in FIG. 1, is thus available for the thermal power dissipation of internal voltage regulators and the like. Typically, in order to keep packaging costs, etc., to a minimum, the remaining available power budget is typically very limited. If internal voltage regulation is performed at high operating frequencies, it is often the case that the required thermal power budget for the internal voltage regulators will exceed the available power budget. Thus, the overall power budget for the IC device may exceed the thermal limit 110 of the IC packaging, as illustrated in FIG. 2. Thus, in order to avoid the IC device overheating during high frequency operation, internal voltage regulators are configured to a bypass mode, with external voltage regulators performing the required voltage regulation.

However, a problem with using external voltage regulators is that, in order to avoid high costs, simple voltage regulators that are typically only capable of providing coarse regulation used. As a result, the ability to achieve a maximum junction voltage using such external voltage regulators is extremely difficult, which limits the achievable operating frequency of the IC device. Thus, it is desirable to minimise the need for relying on such external voltage regulators.

SUMMARY OF THE INVENTION

The present invention provides an integrated circuit device, voltage regulation circuitry and a method for regulating a voltage supply signal within an integrated circuit device as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION

Examples of the present invention will now be described with reference to an example of voltage regulation architecture for an integrated circuit device. However, it will be appreciated that the present invention is not limited to the specific voltage regulation architecture herein described with reference to the accompanying drawings, and may be equally applied to alternative architectures. For example, an integrated circuit device is described comprising a single internal voltage regulator. Alternatively, the present invention may be applied to integrated circuit devices comprising multiple internal voltage regulators. Furthermore, because the illustrated example embodiments of the present invention may, for the most part, be implemented using electronic components and circuits known to those skilled in the art, details will not be explained in any greater extent than that considered necessary as illustrated below, for the understanding and appreciation of the underlying concepts of the present invention and in order not to obfuscate or distract from the teachings of the present invention.

Figure 1:
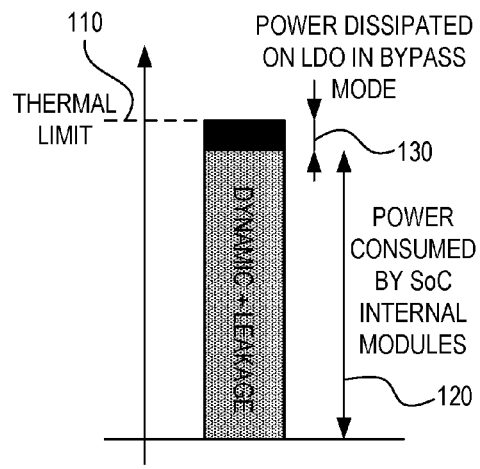
FIGS. 1 to 4 illustrate examples of a thermal power budget for an integrated circuit device.
Figure 2:
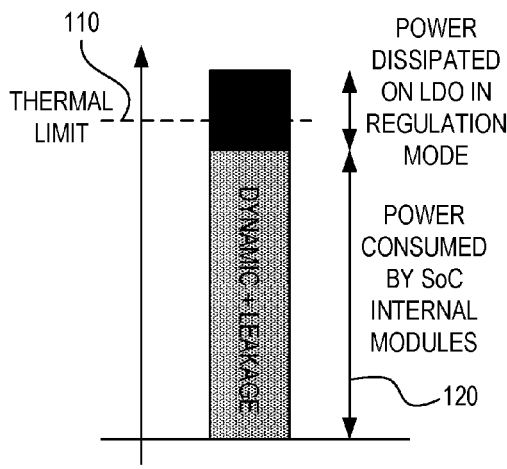
Figure 3:
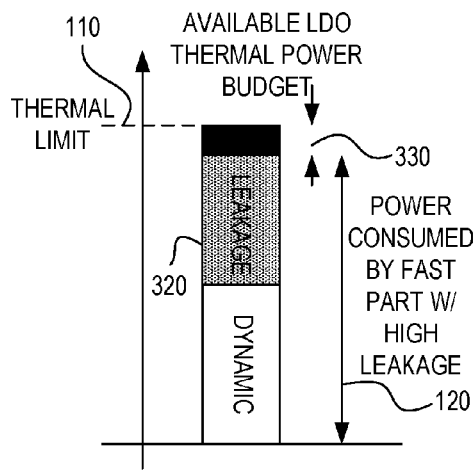

The power consumption of internal SoC modules varies depending on various conditions of the IC device. For example, the power consumption (in particular leakage power consumption) of such internal SoC modules may vary depending upon conditions such as, by way of example only, process corner, ambient temperature, per junction temperature, system activity levels, system configuration, etc. Accordingly, the inventors have recognised that the available power budget for internal voltage regulators, etc., also varies (inversely compared to the power consumption of the internal SoC modules) depending upon such conditions. For example, FIG. 3 illustrates a thermal budget for an IC device in a case where the leakage power of the internal SoC modules of the IC device is high, for example due to the SoC modules comprising fast process corner components having higher power leakage, as illustrated at 320. In this case, since the SoC modules comprise a high power leakage, the remaining available thermal power budget for internal voltage regulation, etc., is relatively small, as illustrated at 330.

Figure 4:
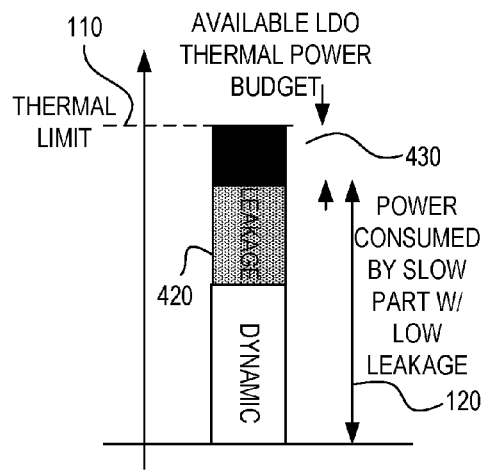

Conversely, FIG. 4 illustrates a thermal budget for an equivalent IC device in a case where the leakage power of the internal SoC modules of the IC device is low, for example due to the SoC modules comprising slow process corner components having lower power leakage, as illustrated at 420. In this case, since the SoC modules comprise a low power leakage, the remaining available thermal power budget for internal voltage regulation, etc., is relatively large (as compared with that illustrated in FIG. 3), as illustrated at 430.

A problem arising from the use of internal voltage regulators is that their use often results in an increased thermal power budget requirement for power dissipation of the integrated circuit device package at high operating frequencies. Thus, in order to avoid the IC device overheating during high frequency operation, internal voltage regulators are configured to a bypass mode, with less accurate external voltage regulators performing the required voltage regulation. Conventionally, the configuration of internal voltage regulators between a bypass mode at higher frequencies and a voltage regulation mode at lower frequencies is substantially generic within (and across) equivalent IC devices. Accordingly, such configuration does not take into account the variations for available power budget for internal voltage regulators, etc., within equivalent IC devices, but rather assumes a substantially extreme case for the available power budget for internal voltage regulators, etc., e.g. as illustrated in FIG. 3. Furthermore, such conventional techniques are not able to take into account other conditions that may cause variations in the available power budget, such as ambient temperature, per junction temperature, system activity levels, system configuration, etc. As such, it is often the case that internal voltage regulation is bypassed at unnecessarily low operating frequencies, since most IC device will not comprise an extreme case for the available power budget for internal voltage regulators, etc., e.g. as illustrated in FIG. 4.

Figure 5:
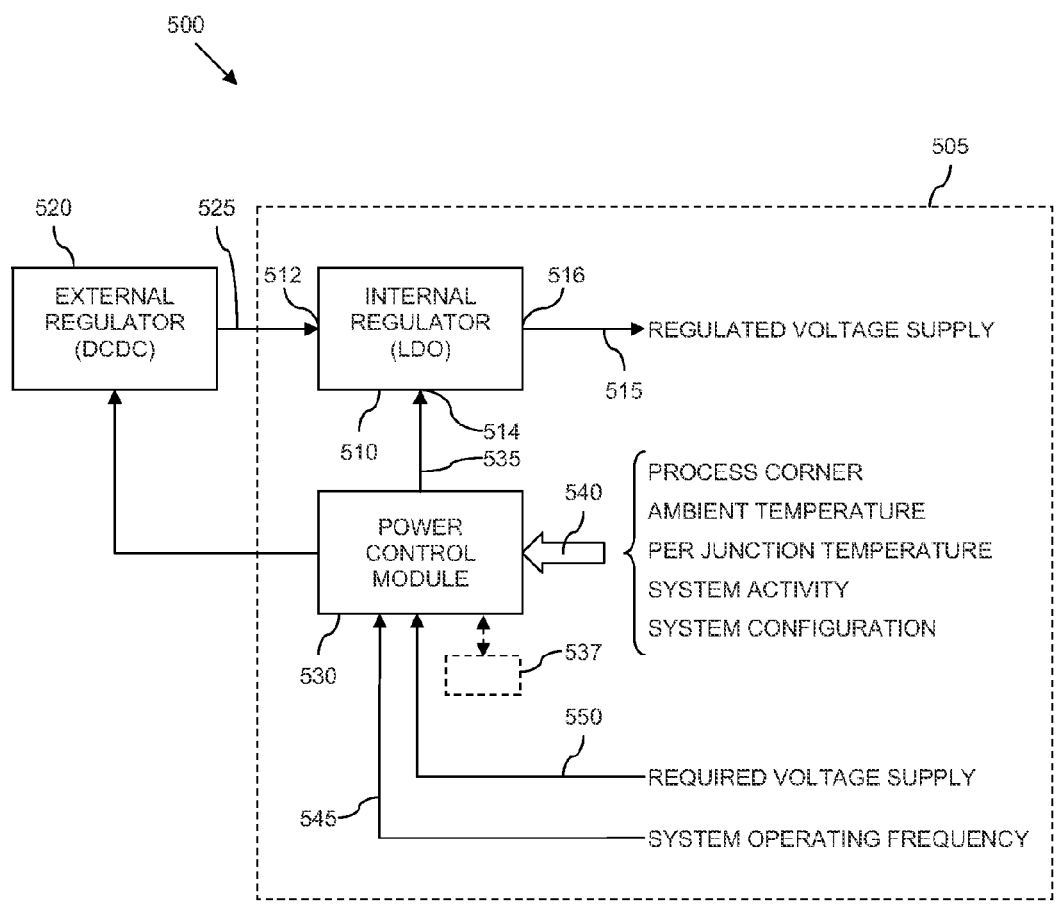
FIG. 5 illustrates an example of voltage regulation circuitry.

Referring now to FIG. 5, there is illustrated an example of voltage regulation circuitry 500 for an IC device 505 in accordance with some example embodiments of the present invention. The voltage regulation circuitry 500 comprises, within the IC device 505, at least one internal voltage regulator, such as the low drop-out (LDO) regulator illustrated at 510. The LDO regulator 510 is arranged to receive a voltage supply signal 525 at a first input 512 thereof, receive a control signal 535 at a second input 514 thereof, regulate the received voltage supply signal 525 in accordance with the received control signal 535, and provide a regulated voltage supply signal 515 at an output 516 thereof. The voltage regulation circuitry 500 further comprises, also within the IC device 505 for the illustrated example, at least one voltage regulation power control module 530 operably coupled to the second input 514 of the internal voltage regulator 510 and arranged to provide the control signal 535 thereto. The voltage regulation power control module 530 is further arranged to receive at least one IC device conditional indication, illustrated generally at 540, and to generate the control signal 535 for the internal voltage regulator 510, based at least partly on an available thermal power budget for the IC device 505 corresponding to the at least one IC device conditional indication 540.

In this manner, by generating the control signal 535 for the internal voltage regulator 510 based on such an available thermal power budget for the IC device 505, the configuration of internal voltage regulator 510 between, say, a bypass mode at higher frequencies and a voltage regulation mode at lower frequencies may be adapted in accordance with the received at least one IC device conditional indication 540. Accordingly, such configuration may take into account variations of available thermal power budget for internal voltage regulators, etc., within equivalent IC devices, thereby enabling a more appropriate configuration of the internal voltage regulator 510 as compared with conventional techniques. Furthermore, such configuration may also, substantially dynamically, take into account variations of thermal power budget for internal voltage regulators, etc., within an IC device that results from, say, variations in ambient temperature, per junction temperature, system activity levels, system configuration, etc.

In some examples, the at least one IC device conditional indication 540 may comprise any appropriate indication(s). For example, the received at least one IC device conditional indication 540 may comprise an indication of one or more IC device specific condition(s), such as process corner, etc. Additionally and/or alternatively, in some examples, the received at least one IC device conditional indication 540 may comprise an indication of one or more environmental conditions, such as ambient temperature, and/or one or more changeable device/system conditions, such as per junction temperature, system activity level, system configuration, etc. Accordingly, it is contemplated that the at least one IC device conditional indication 540 may comprise at least one from a group consisting of:
- an indication of a process corner for the IC device;
- an indication of an ambient temperature for the IC device;
- an indication of a per junction temperature for the IC device;
- an indication of a level of system activity within the IC device; and
- an indication of a system configuration within the IC device.

In some examples, the voltage regulation power control module 530 may be arranged to generate the control signal 535 for the internal voltage regulator(s) 510 in any suitable manner. For example, in some embodiments of the present invention the voltage regulation power control module 530 may be arranged to access one or more predefined lookup table(s) (LUTs) stored within a memory element, such as illustrated at 537. In some examples, the LUTs may comprise values output by an algorithm for generating an appropriate value for the control signal 535 based at least partly on the received at least one IC device conditional indication 540. In this manner, the voltage regulation power control module may be arranged to retrieve from the one or more LUT(s) an appropriate value for the control signal 535, based at least partly on the received at least one IC device conditional indication 540. Alternatively, in some further example embodiments of the present invention, the voltage regulation power control module 530 may be arranged to implement an algorithm for generating an appropriate value for the control signal 535, based at least partly on the received at least one IC device conditional indication 540. For example, the voltage regulation power control module 530 may be arranged to implement such an algorithm within one or more dedicated hardware block(s). Alternatively, the voltage regulation power control module 530 may be arranged to implement such an algorithm within software, for example by way of a microcontroller or other programmable logic module that is arranged to execute instructions stored within a memory element, such as memory, illustrated at 537 in FIG. 5. Alternatively still, the voltage regulation power control module 530 may be arranged to implement such an algorithm within a combination of software and one or more dedicated hardware block(s).

The voltage regulation power control module 530 is arranged to generate the control signal 535 for the internal voltage regulator(s) 510 based at least partly on an available thermal power budget for the IC device 505 corresponding to the at least one IC device conditional indication 540. The available thermal power budget for the IC device 505 may be determined based at least partly on a thermal power limit for the IC device 505, for example as illustrated at 110 in FIGS. 1 to 4, and a determined power consumption for internal System on Chip (SoC) modules (not shown) for the IC device 505, for example as illustrated at 120 in FIGS. 1 to 4. Accordingly, the power consumption of such internal SoC modules may be estimated based on the received indications of such conditions 540 using power consumption models for the internal SoC modules developed during development of the IC device 505, etc.

In accordance with some examples, if the available thermal power budget for the IC device 505 is less than a threshold value, the voltage regulation power control module 530 may be arranged to generate a control signal 535 to cause the internal voltage regulator(s) 510 to enter a bypass mode, whereby the internal voltage regulator(s) 510 provides the received voltage supply signal 525 unregulated at the output 516 thereof. Thus, when the internal voltage regulator 510 is operating in such a bypass mode, the regulated voltage supply signal 515 effectively comprises the voltage supply signal 525 received by the internal voltage regulator 510. Furthermore, for the illustrated example, the voltage regulation power control module 530 may be further operably coupled to at least one external voltage regulator 520 for generating the voltage supply signal 525 received by the internal voltage regulator(s) 510. If the available thermal power budget for the IC device 505 is less than such a threshold value, the voltage regulation power control module 530 may configure the at least one external voltage regulator 520 to output a voltage supply signal 525 regulated to approximately a required voltage level.

Conversely, if the available thermal power budget for the IC device 505 is greater than the threshold value, the voltage regulation power control module 530 may be arranged to generate a control signal 535 to cause the internal voltage regulator(s) 510 to regulate the voltage supply signal 525 received thereby, in order to output a regulated voltage supply signal 515 that is regulated to approximately at least a required voltage level. For the illustrated example, if the available thermal power budget for the IC device 505 is greater than the threshold value, the voltage regulation power control module 530 may further be arranged to configure the at least one external voltage regulator 520 to output an appropriate voltage supply signal 525 to be regulated by the internal voltage regulator 510.

As mentioned above, one example of an IC conditional indication 540 to which an available thermal power budget for the IC device 505 may correspond, and thus on which the configuration of the voltage regulators 510, 520 may be at least partly based, is the process corner for the IC device. For such an IC conditional indication 540, in the case of a fast process corner for the IC device 505, because of the higher power leakage of fast process corner components, the available thermal power budget for the IC device will typically be lower. Accordingly, the voltage regulation power control module 530 is likely to cause the internal voltage regulator 510 to enter a bypass mode more readily, with voltage regulation being provided by the external voltage regulator 520. As will be appreciated by a skilled artisan, it is typically not necessary to provide a maximum junction voltage for the high speed process corner components in order to achieve a required operating frequency for the IC device 505. Thus, in the case of a fast process corner, the coarse voltage regulation provided by the use of the low cost external voltage regulator 520 is typically sufficient.

Conversely, in the case of a slow process corner, in order to achieve a required high operating frequency for the IC device 505, the voltage supply signal is typically required to more accurately achieve a maximum junction voltage. Significantly, in the case of such a slow process corner for the IC device 505, because of the lower power leakage of slow process corner components, the available thermal power budget for the IC device will typically be higher. Accordingly, the voltage regulation power control module 530 is likely to cause the internal voltage regulator 510 to enter a bypass mode less readily, with voltage regulation able to be provided by the more accurate internal voltage regulator 520.

In accordance with some examples, such a threshold value may correspond to a required thermal power budget for the internal voltage regulator(s) 510. In this manner, if the available thermal power budget for the IC device 505 is greater than the threshold value, e.g. greater than a required thermal power budget for the internal voltage regulator(s) 510, then configuring the internal voltage regulator to perform voltage regulation will not cause the thermal power limit for the IC device to be exceeded. Conversely, if the thermal power budget for the IC device 505 is less than the threshold value, e.g. less than a required thermal power budget for the internal voltage regulator(s) 510, then configuring the internal voltage regulator to perform voltage regulation will cause the thermal power limit for the IC device to be exceeded.

A problem arising from the use of such internal voltage regulators is that their use 'on-chip' often results in an increased thermal power budget at higher operating frequencies. Accordingly, in some examples, the required thermal power budget for the internal voltage regulator(s) 510, and thereby the threshold value, may be determined based at least partly on an operating frequency for the IC device 505. Thus, for the illustrated example, the voltage regulation power control module 530 may be further arranged to receive an indication of an operating frequency 545 for the IC device 505, and to determine a required thermal power budget for the internal voltage regulator(s) 510 based at least partly on the indication of an operating frequency 545 for the IC device 505.

For the example illustrated in FIG. 5, the voltage regulation power control module 530 is further arranged to receive an indication of a required voltage level 550 at which the voltage supply signal 515 is to be regulated. Accordingly, the voltage regulation power control module 530 may be arranged to cause the regulated voltage supply signal 515 to be regulated to the required voltage level in accordance with the received voltage level indication 550, such regulation being provided by way of the internal voltage regulator 515 and/or the external voltage regulator 520. In some examples, such a required voltage level indication 550 may be further used to determine the power consumption of the internal SoC modules, and thus the available thermal power budget for the internal voltage regulator(s) 510.

For the illustrated example, the internal voltage regulator comprises a low-dropout (LDO) regulator, thereby advantageously enabling a low voltage drop when in a bypass mode. However, some examples of the present invention are not limited to use with such an internal LDO voltage regulator, but may be equally applied using any suitable alternative type of internal voltage regulator.

Figure 6:
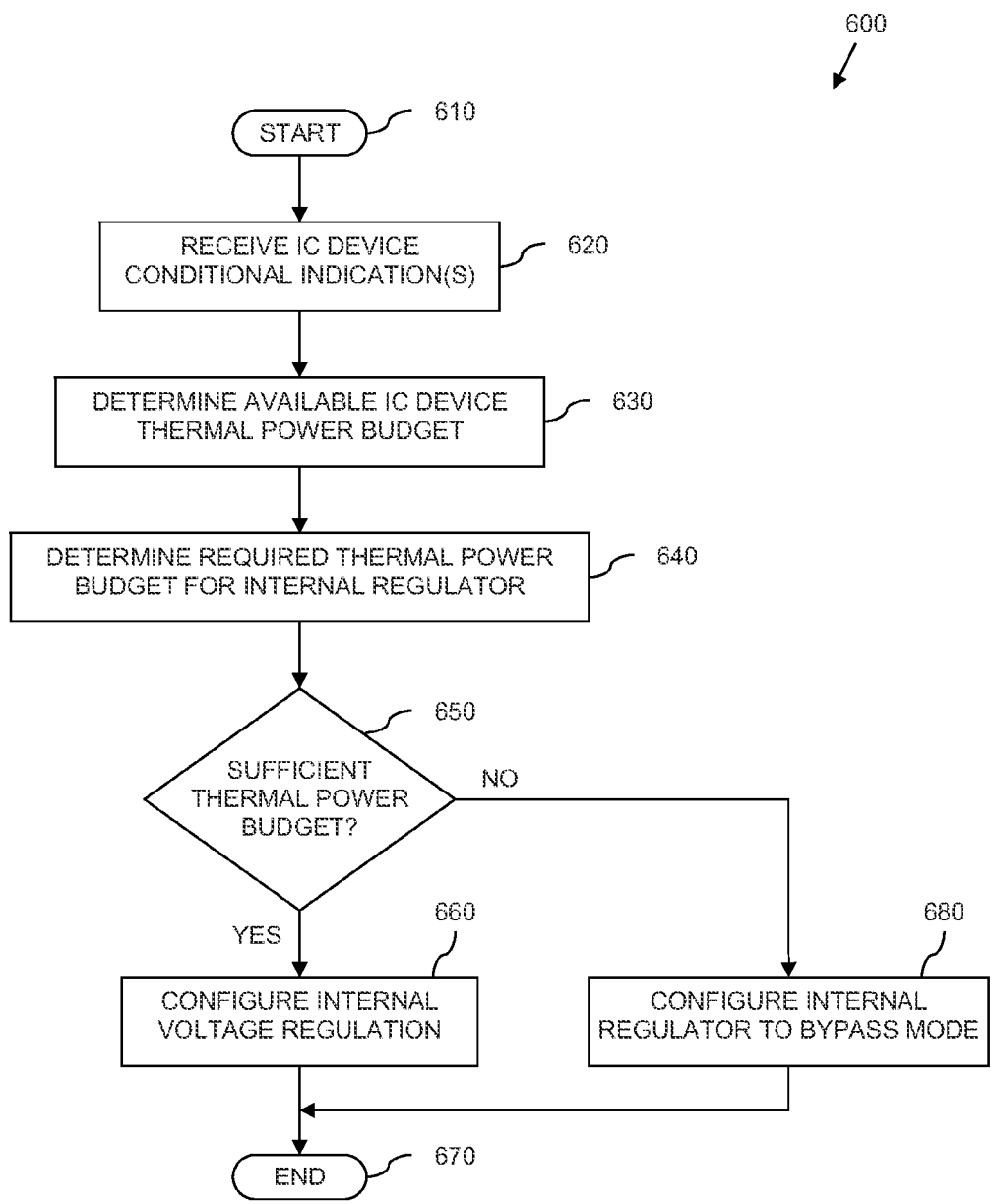
FIG. 6 illustrates a simplified flowchart of an example of a method for regulating a voltage supply signal within an integrated circuit device.

Referring now to FIG. 6, there is illustrated a simplified flowchart 600 of an example of a method for regulating a voltage supply signal within an integrated circuit (IC) device, such as may be implemented, at least partly, within the IC device 505 of FIG. 5. The method starts at step 610, and moves on to step 620 where at least one IC device conditional indication is received. Next, at step 630, an available thermal power budget for the IC device is determined. A required thermal power budget for at least one internal voltage regulator is then determined at step 640. It is then determined whether there is a sufficient thermal power budget available, for example by comparing the determined available and required thermal power budgets, at step 650. If it is determined that there is a sufficient thermal power budget available, for example if the available thermal power budget for the IC device determined in step 630 is greater than the required thermal power budget determined in step 640, the method moves on to step 660 where the at least one internal voltage regulator is configured to regulate a voltage supply signal received thereby, and to output a regulated voltage supply signal regulated to approximately a required voltage level. The method then ends at step 670. Conversely, if at step 650 it is determined that there is an insufficient thermal power budget available, for example if the available thermal power budget for the IC device determined in step 630 is less than the required thermal power budget determined in step 640, the method moves on to step 680 where the at least one internal voltage regulator is configured to enter a bypass mode. The method then ends at step 670.

Thus, and as will be appreciated by a skilled artisan, by configuring an internal voltage regulator based on an available thermal power budget for an IC device as hereinbefore described, the configuration of the internal voltage regulator between, say, a bypass mode at higher frequencies and a voltage regulation mode at lower frequencies may be adapted in accordance with received at least one IC device conditional indication. Accordingly, such a configuration may take into account, for example, variations of available thermal power budget for internal voltage regulators, etc., within equivalent IC devices, thereby enabling a more appropriate configuration of the internal voltage regulator as compared with conventional techniques. Furthermore, such a configuration may also, substantially dynamically, take into account variations of available thermal power budget for internal voltage regulators, etc., within an IC device resulting from, say, variations in ambient temperature, per junction temperature, system activity levels, system configuration, etc.

In this manner, the point at which an internal voltage regulator is required to be configured to a bypass mode in order to prevent a thermal power limit for the IC device from being exceeded may be more accurately determined. As a result, a less cautious approach to internal voltage regulation may be adopted as compared to conventional techniques, thereby reducing a need to rely on less accurate voltage regulators, and thereby enabling higher junction voltages within the IC device to be achieved more often.

The invention may also be implemented, at least in part, in a computer program for running on a computer system, at least including code portions for performing steps of a method according to the invention when run on a programmable apparatus, such as a computer system or enabling a programmable apparatus to perform functions of a device or system according to the invention.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on computer readable storage medium or transmitted to the computer system via a computer readable transmission medium. All or some of the computer program may be provided on computer readable media permanently, removably or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; non-volatile memory storage media including semiconductor-based memory units such as FLASH memory, electrically erasable programmable read only memory (EEPROM), electrically programmable read only memory (EPROM), read only memory (ROM); ferromagnetic digital memories; magnetic random access memory (MRAM); volatile storage media including registers, buffers or caches, main memory, random access memory (RAM), etc.; and data transmission media including computer networks, point-to-point telecommunication equipment, and carrier wave transmission media, to name just a few.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. For example, for the example illustrated in FIG. 5, the voltage regulation power control module 530 has been illustrated as a single, stand alone logic block. However, it will be appreciated that the functionality of such a voltage regulation power control module 530 may equally be dispersed across numerous logic blocks.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediary components. Likewise, any two components so associated can also be viewed as being "operably connected," or "operably coupled", to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. For example, and as illustrated in FIG. 5, the invention has been implemented by way of a single voltage regulation power control module 530 arranged to provide a control signal to a single internal voltage regulator 510; the voltage regulation power control module 530 and the internal voltage regulator 510 being located within the same integrated circuit device 505. However, it is contemplated that the voltage regulation power control module 530 need not be located within the same integrated circuit device 505 as the internal voltage regulator 510. Furthermore, it is contemplated that a single voltage regulation power control module 530 may be arranged to provide control signals to a plurality of internal voltage regulators; said internal voltage regulators being located within the same and/or different integrated circuit devices.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an", as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an". The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. An integrated circuit (IC) device comprising:
   at least one internal voltage regulator arranged to
   receive a voltage supply signal at a first input thereof,
   receive a control signal at a second input thereof,
   regulate the received voltage supply signal in accordance with the received control signal, and
   provide a regulated voltage supply signal at an output thereof;
   at least one voltage regulation power control module operably coupled to the second input of the at least one internal voltage regulator and arranged to
   provide the control signal thereto, receive at least one IC device conditional indication, and
generate the control signal for the least one internal voltage regulator based at least partly on an available thermal power budget for the IC device corresponding to the at least one IC device conditional indication, wherein the at least one voltage regulation power control module is arranged to generate the control signal to cause the at least one internal voltage regulator to enter a bypass mode, and, in response to the control signal, the at least one internal voltage regulator provides the received voltage supply signal unregulated at an output thereof, if the available thermal power budget for the IC device corresponding to the at least one IC device conditional indication is less than a threshold value.

2. The IC device of claim 1 further comprising:
at least one external voltage regulator for generating the voltage supply signal received at the first input of the at least one internal voltage regulator, wherein each of the at least one external voltage regulator is operably coupled to a corresponding one of the at least one voltage regulation power control module.

3. The IC device of claim 2 wherein the voltage regulator power control module is arranged to configure the external voltage regulator to output a voltage supply signal regulated to a required voltage level, if the available thermal power budget for the IC device corresponding to the at least one IC device conditional indication is less than a threshold value.

4. The IC device of claim 1 wherein the voltage regulation power control module is arranged to generate a control signal to cause the at least one internal voltage regulator to output a regulated voltage supply signal regulated to a required voltage level, if the available thermal power budget for the IC device corresponding to the at least one IC device conditional indication is greater than the threshold value.

5. The IC device of claim 1 wherein the threshold value corresponds to a required thermal power budget for the at least one internal voltage regulator.

6. The IC device of claim 5 wherein the voltage regulation power control module is further arranged to receive an indication of an operating frequency for the IC device, and to determine a required thermal power budget for the at least one internal voltage regulator based at least partly on the indication of the operating frequency.

7. The IC device of claim 1 wherein the at least one IC device conditional indication comprises at least one from a group consisting of:
an indication of a process corner for the IC device;
an indication of an ambient temperature for the IC device;
an indication of a per junction temperature for the IC device;
an indication of a level of system activity within the IC device;
an indication of a system configuration within the IC device.

8. The IC device of claim 1 wherein the available thermal power budget for the IC device is determined based at least partly on a thermal power limit for the IC device and a determined power consumption for internal System on Chip (SoC) modules for the IC device.

9. The IC device of claim 1 wherein the voltage regulation power control module is further arranged to receive an indication of a required voltage level at which the voltage supply signal is to be regulated.

10. The IC device of claim 1 wherein the at least one internal voltage regulator comprises a low drop-out (LDO) voltage regulator.

11. A method for regulating a voltage supply signal within an integrated circuit (IC) device, the method comprising:
determining a required thermal power budget for the at least one internal voltage regulator; and
configuring at least one internal voltage regulator of the IC device based at least partly on an available thermal power budget for an IC device corresponding to an at least one IC device conditional indication, wherein at least one voltage regulation power control module is arranged to generate a control signal to cause the at least one internal voltage regulator to enter a bypass mode, with the at least one internal voltage regulator providing the received voltage supply signal unregulated at an output of the internal voltage regulator corresponding to the at least one IC device conditional indication indicating the available thermal power budget for the IC device being less than a threshold value.

12. The method of claim 11 wherein the method further comprises:
determining the available thermal power budget for the IC device; and
configuring the at least one internal voltage regulator based at least partly on a comparison between the available thermal power budget for the IC device and the required thermal power budget for the at least one internal voltage regulator.

13. The method of claim 12 further comprising configuring a bypass mode for the at least one internal voltage regulator if the determined required thermal power budget for the at least one internal voltage regulator is greater than the determined available thermal power budget for the IC device.

14. An integrated circuit (IC) device comprising:
at least one internal voltage regulator arranged to
receive a voltage supply signal at a first input thereof,
receive a control signal at a second input thereof,
regulate the received voltage supply signal in accordance with the received control signal, and
provide a regulated voltage supply signal at an output thereof;
at least one voltage regulation power control module operably coupled to the second input of the at least one internal voltage regulator and arranged to
provide the control signal thereto,
receive at least one IC device conditional indication, and
generate, by accessing a look up table, the control signal for the at least one internal voltage regulator based at least partly on an available thermal power budget for the IC device corresponding to the at least one IC device conditional indication, and, in response to the control signal with the available thermal power budget for the IC device corresponding to the at least one IC device conditional indication being less than a threshold value, the at least one internal voltage regulator enters a bypass mode and provides the received voltage supply signal unregulated at an output thereof.

15. The IC device of claim 14 wherein the available thermal power budget for the IC device takes into account variations of an internal voltage regulator available thermal power budget for the at least one internal voltage regulator.

16. The IC device of claim 15 wherein the variations of the internal voltage regulator available thermal power budget result from variations in ambient temperature.

17. The IC device of claim 15 wherein the variations of the internal voltage regulator available thermal power budget result from variations in per junction temperature.

18. The IC device of claim 14 wherein the available thermal power budget for the IC device is based at least partly on a determined power consumption for at least one internal System on Chip (SoC) module.

\* \* \* \* \*